United States Patent
Oh et al.

(10) Patent No.: US 9,741,914 B2
(45) Date of Patent: Aug. 22, 2017

(54) LENS FOR LIGHT-EMITTING DEVICE AND METHOD OF MANUFACTURING LIGHT-EMITTING DEVICE PACKAGE

(71) Applicant: LUMENS CO., LTD., Gyeonggi-do (KR)

(72) Inventors: Seung Hyun Oh, Gyeonggi-do (KR); Yun Geon Cho, Gyeonggi-do (KR); Young Mi Na, Daegu (KR); Byeong Cheol Shim, Gyeonggi-do (KR); Bo Gyun Kim, Gyeonggi-do (KR); Jong Kyung Lee, Gyeonggi-do (KR)

(73) Assignee: LUMENS CO., LTD., Yongin-si (KR)

( * ) Notice: Subject to any disclaimer, the term of this patent is extended or adjusted under 35 U.S.C. 154(b) by 0 days.

(21) Appl. No.: 14/830,294

(22) Filed: Aug. 19, 2015

(65) Prior Publication Data
US 2016/0053965 A1    Feb. 25, 2016

(30) Foreign Application Priority Data

Aug. 20, 2014 (KR) .................. 10-2014-0108347
Oct. 29, 2014 (KR) .................. 10-2014-0148656
(Continued)

(51) Int. Cl.
*H01L 33/62*    (2010.01)
*G02F 1/1335*   (2006.01)
(Continued)

(52) U.S. Cl.
CPC ........ *H01L 33/62* (2013.01); *G02F 1/133603* (2013.01); *H01L 33/56* (2013.01);
(Continued)

(58) Field of Classification Search
CPC ... G02F 1/133603; G02F 2001/133607; G02B 3/04; G02B 17/0864; H01L 33/58
(Continued)

(56) References Cited

U.S. PATENT DOCUMENTS 8,167,462 B2 *   5/2012   Kim .................... F21S 8/08
                                                362/311.02
8,641,238 B2 *   2/2014   Chiu ................... F21V 3/00
                                                362/311.02
(Continued)

FOREIGN PATENT DOCUMENTS

JP    2003-514396 A    4/2003
JP    2009-534799 A    9/2009
(Continued)

*Primary Examiner* — Laura Tso
(74) *Attorney, Agent, or Firm* — Ichthus International Law, PLLC

(57) ABSTRACT

Disclosed are a lens for a light-emitting device usable in a display apparatus or a lighting apparatus, and a method of manufacturing a light-emitting device package. The lens may include a lens body including a light-receiving portion provided in a lower surface of the lens body, a light-emitting portion provided on an upper surface of the lens body, and a recess provided at a center of the upper surface of the lens body, and a flat portion provided in a horizontal shape on a bottom surface of the recess perpendicularly to a main emission line of light emitted from a light-emitting device to emit at least a part of light received through the light-receiving portion, upward. A diameter of the flat portion may be $\frac{1}{100}$ to $\frac{1}{10}$ of an inlet diameter of the light-receiving portion.

10 Claims, 13 Drawing Sheets

(30) Foreign Application Priority Data

Oct. 29, 2014 (KR) .................. 10-2014-0148657
Oct. 29, 2014 (KR) .................. 10-2014-0148658

(51) Int. Cl.
*H01L 33/56* (2010.01)
*H01L 33/60* (2010.01)
*H01L 33/58* (2010.01)
*G02B 17/08* (2006.01)
*G02B 3/04* (2006.01)

(52) U.S. Cl.
CPC ............... *H01L 33/60* (2013.01); *G02B 3/04* (2013.01); *G02B 17/0864* (2013.01); *G02F 2001/133607* (2013.01); *H01L 33/58* (2013.01); *H01L 2933/005* (2013.01); *H01L 2933/0058* (2013.01); *H01L 2933/0066* (2013.01)

(58) Field of Classification Search
USPC ............................................ 362/336, 311.02
See application file for complete search history.

(56) References Cited

U.S. PATENT DOCUMENTS

| | | | | |
|---|---|---|---|---|
| 2012/0044700 | A1* | 2/2012 | Chen | F21V 3/00 362/311.02 |
| 2013/0121000 | A1* | 5/2013 | Lee | H01L 33/56 362/293 |
| 2014/0160767 | A1* | 6/2014 | Chen | F21V 5/002 362/308 |
| 2014/0254172 | A1* | 9/2014 | Wang He | G02B 19/0009 362/311.02 |

FOREIGN PATENT DOCUMENTS

| | | |
|---|---|---|
| KR | 10-2007-0063743 A | 6/2007 |
| KR | 100733074 B1 | 6/2007 |
| KR | 10-2008-0045942 A | 5/2008 |
| KR | 10-0986468 B1 | 10/2010 |
| KR | 10-2011-0011405 A | 2/2011 |
| KR | 10-2011-0119287 A | 11/2011 |
| KR | 10-2012-0072629 A | 7/2012 |
| KR | 10-2013-0054040 A | 5/2013 |
| KR | 10-2013-0081867 A | 7/2013 |

* cited by examiner

LENS FOR LIGHT-EMITTING DEVICE AND METHOD OF MANUFACTURING LIGHT-EMITTING DEVICE PACKAGE

CROSS-REFERENCE TO RELATED PATENT APPLICATION

This application claims the benefit of Korean Patent Application Nos. 10-2014-0108347, filed on Aug. 20, 2014, 10-2014-0148656, filed on Oct. 29, 2014, 10-2014-0148657, filed on Oct. 29, 2014, and 10-2014-0148658, filed on Oct. 29, 2014, respectively, in the Korean Intellectual Property Office, the disclosure of which is incorporated herein in its entirety by reference.

BACKGROUND

1. Field

The present invention relates to a lens for a light-emitting device and a method of manufacturing a light-emitting device package and, more particularly, to a lens for a light-emitting device usable in a display apparatus or a lighting apparatus, and a method of manufacturing a light-emitting device package.

2. Description of the Related Art

A light-emitting diode (LED) refers a type of semiconductor element capable of displaying light of various colors by forming a light-emitting source using a PN diode of a compound semiconductor. The LED has a long life, a small size, and a small weight, and can be driven using a low voltage. In addition, the LED is durable against impact and vibration, does not require preheating or complicated driving, and is mountable on a substrate or a lead frame in various forms before packaging. As such, the LED may be modularized for various purposes and used in a backlight unit or a variety of lighting apparatuses.

The LED is mounted on the surface of a circuit board and used in a variety of electronic devices. In this case, a lens may be mounted on the LED to diffuse light emitted from the LED.

In general, a lens used in a direct backlight unit may have a hemispherical light-emitting portion, and a sharp concave recess may be provided at the center of the lens to induce light emitted through the light-emitting portion, toward side directions.

However, according to the conventional lens having the sharp concave recess, the amount of light is excessively reduced at the center and light refracted by a spherical surface having a certain curvature is totally reflected and emitted without being sufficiently scattered. As such, a dark ring or a bright ring is generated and thus the uniformity of light is reduced.

In addition, the conventional lens has a simply flat or large-gridded bottom surface. However, in this case, light is easily lost through the bottom surface and thus the efficiency of light is greatly reduced.

SUMMARY

The present invention provides a lens for a light-emitting device, capable of controlling the amount of light proceeding straightly upward from the center of a light-emitting portion by providing a flat portion at the center of the light-emitting portion, of remarkably increasing the efficiency of light by providing micro-depressions having a size in micrometers in a bottom portion of the lens to scatter, diffuse, or reflect light inward, preventing a dark part, a dark ring, a bright part, or a bright ring, of improving overall uniformity of light by maintaining an appropriate amount of light, and thus increasing a total amount of light, and a method of manufacturing a light-emitting device package. However, the scope of the present invention is not limited thereto.

According to an aspect of the present invention, there is provided a lens for a light-emitting device, the lens including a lens body including a light-receiving portion provided in a lower surface of the lens body, a light-emitting portion provided on an upper surface of the lens body, and a recess provided at a center of the upper surface of the lens body, and a flat portion provided in a horizontal shape on a bottom surface of the recess and perpendicular to a main emission line of light emitted from a light-emitting device such that at least part of light received through the light-receiving portion emits upwardly, wherein a diameter of the flat portion is $1/100$ to $1/10$ of an inlet diameter of the light-receiving portion.

The light-receiving portion may be a dome-shaped recess which is concave upward, the light-emitting portion may have a cross section including a left hemisphere having a first curvature and having a first curvature center located at a left side of a centerline, and a right hemisphere having the first curvature and having a second curvature center located at a right side of the centerline, the recess may have a cross section including a left recess provided from a top surface of the left hemisphere toward a top center point of the light-receiving portion, and a right recess provided from a top surface of the right hemisphere toward the top center point of the light-receiving portion, and the flat portion may have a cross section provided between the left and right recesses.

Each of the left and right recesses may further include a convex portion protruding from a virtual extension line of the left and right hemispheres by a protruding height to control an amount of light emitted upward from the recess.

The protruding height may be 60% to 80% of the diameter of the flat portion.

The convex portion may include a second curvature portion provided relatively close to the flat portion and having a second curvature, and a third curvature portion provided relatively far from the flat portion, connected to the second curvature portion, and having a third curvature.

The third curvature may be less than the first curvature and greater than the second curvature.

The second curvature may be less than the first curvature and greater than the third curvature.

According to another aspect of the present invention, there is provided a lens for a light-emitting device, the lens comprising: a lens body that includes a light-receiving portion for providing a space for accommodating the light-emitting device, receiving light emitted from the light-emitting device, and provided in a concave shape at a center of a lower surface of the lens body, a bottom portion provided in a horizontal shape along an edge of the lower surface of the lens body, and a light-emitting portion for emitting the received light and provided on an upper surface of the lens body, and micro-depressions provided in the bottom portion of the lens body and having a size in micrometers to reflect or scatter at least a part of light proceeding toward the bottom portion inside the lens body, wherein the micro-depressions have a concave shape into the lens body, and spaced apart from a region where the light-emitting device is located, not to allow the light emitted from the light-emitting device to pass the micro-depressions.

The lens body may be produced by injection-molding a light-transmitting base material using a mold, and the micro-depressions may be produced using a bottom portion counterpart surface-processed in the mold through electric discharge machining (EDM).

The micro-depressions may have a size of 3 micrometers to 15 micrometers.

The micro-depressions may include first depressions provided close to the light-receiving portion and having a first size, and second depressions provided far from the light-receiving portion and having a second size.

According to another aspect of the present invention, there is provided a method of manufacturing a light-emitting device package, the method including preparing an alignment jig including one or more alignment pins, aligning a lead frame strip on the alignment jig by passing the alignment pins through alignment holes of the lead frame strip having mounted a plurality of light-emitting devices thereon, applying an adhesive in a plurality of lens holes of the aligned lead frame strip, and aligning the lens strip on the lead frame strip by passing the alignment pins through alignment holes of the lens strip including a plurality of lenses connected to each other, and inserting and bonding at least parts of the lenses into the lens holes in which the adhesive is applied.

The method may further include curing the adhesive by heating the lead frame strip and the lens strip bonded to each other.

The method may further include singulating the lead frame strip and the lens strip having the cured adhesive therebetween, into individual light-emitting device packages.

The interconnected lenses of the lens strip may be located to correspond to the lens holes provided in a reflective encapsulant, the lead frame strip may include the reflective encapsulant molded in a plurality of pieces, and a plurality of lead frames having mounted a plurality of light-emitting devices thereon and connected to each other in reflective cups of the reflective encapsulant, and the adhesive may include an epoxy component.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION

Figure 1:
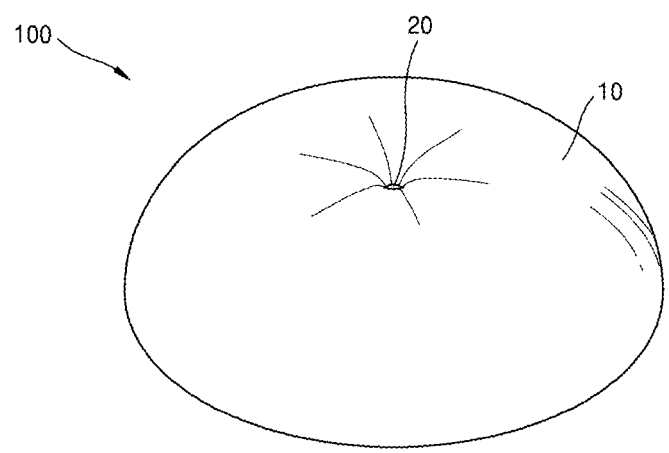
FIG. 1 is a perspective view of a lens for a light-emitting device, according to some embodiments of the present invention.

Hereinafter, the present invention will be described in detail by explaining embodiments of the invention with reference to the attached drawings.

The invention may, however, be embodied in many different forms and should not be construed as being limited to the embodiments set forth herein; rather, these embodiments are provided so that this disclosure will be thorough and complete, and will fully convey the concept of the invention to one of ordinary skill in the art. In the drawings, the thicknesses or sizes of layers are exaggerated for clarity.

Figure 2:
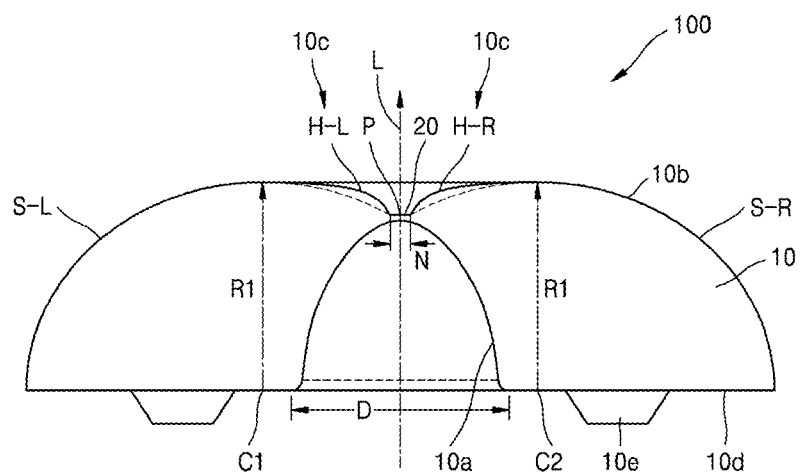
FIG. 2 is a cross-sectional view of the lens of FIG. 1.
Figure 3:
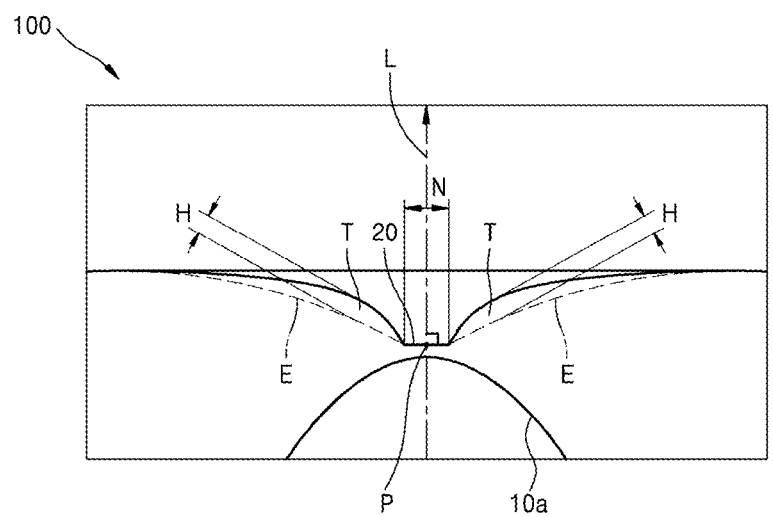
FIG. 3 is a magnified cross-sectional view of a flat portion of the lens of FIG. 2.

FIG. 1 is a perspective view of a lens 100 for a light-emitting device, according to some embodiments of the present invention, FIG. 2 is a cross-sectional view of the lens 100 of FIG. 1, and FIG. 3 is a magnified cross-sectional view of a flat portion 20 of the lens 100 of FIG. 2.

As illustrated in FIGS. 1 to 3, the lens 100 according to some embodiments of the present invention may mainly include a lens body 10 and the flat portion 20. For example, as illustrated in FIG. 1, the lens body 10 may be an integrated structure formed of a light-transmitting material and including a light-receiving portion 10a provided in a lower surface of the lens body 10 and a light-emitting portion 10b provided on an upper surface of the lens body 10.

For example, the lens body 10 may include a recess 10c provided at the center of the upper surface of the lens body 10, a lens bottom 10d provided on the lower surface of the lens body 10, and one or more lens legs 10e protruding downward from the lens bottom 10d by a certain length.

Here, the recess 10c, the lens bottom 10d, and the lens legs 10e may also be formed of the light-transmitting material integrated with the lens body 10.

However, the light-receiving portion 10a, the light-emitting portion 10b, the recess 10c, the lens bottom 10d, and the lens legs 10e of the lens body 10 are not limited to the drawings, and may be modified or changed to a variety of designs, shapes, materials, etc. without departing from the technical idea of the present invention.

Here, when light passes through an interface between different media such as air and a lens, the direction of the light is changed and a refraction angle based on the direction of the light may vary depending on properties of the medium. For example, the refraction angle may vary depending on optical characteristics of the lens body 10. Accordingly, the optical characteristics may be optimized based on a material, a refractive index, a shape, or optical characteristics of the lens body 10.

For example, when the lens body 10 is formed of glass, the refractive index may be 1.45 to 1.96. Lead (Pb) or barium (Ba) may be added to increase the refractive index, and iron (Fe) may be added to reduce the refractive index. Specifically, the lens body 10 may be formed of at least material selected from the group consisting of glass, acryl, epoxy resin, epoxy molding compound (EMC), epoxy resin composition, silicon resin composition, modified epoxy resin composition, modified silicon resin composition, polyimide resin composition, modified polyimide resin composition, polyphthalamide (PPA), polycarbonate resin, polyphenylene sulfide (PPS), liquid crystal polymer (LCP), acrylonitrile butadiene styrene (ABS) resin, phenolic resin, acrylic resin, polybutylene terephthalate (PBT) resin, etc.

Alternatively, the lens body 10 may be formed of a polycarbonate-based, polysulphone-based, polyacrylate-based, polysthylene-based, polyvinyl chloride-based, polyvinyl alcohol-based, or polynorbornene-based material, polyester, or the like, or may be formed of any of a variety of light-transmitting resin-based materials. A scattering pattern or a scattering member may be provided using a variety of schemes to increase dispersion properties of light. For example, a fine pattern, fine depressions, a diffusion layer, or fine bubbles may be provided on or in the surface of or inside the lens body 10.

Meanwhile, as illustrated in FIGS. 1 to 3, the flat portion 20 may be provided in a horizontal shape on a part of the surface of the recess 10c in such a manner that at least a part of light received through the light-receiving portion 10a is emitted upward.

For example, as illustrated in the magnified view of FIG. 3, the flat portion 20 may be provided on a bottom surface of the recess 10c perpendicularly to a main emission line L of light emitted from a light-emitting device 1 (see FIG. 4) and received through the light-receiving portion 10a. Here, the main emission line L may refer to an axis along a path on which the largest amount of light proceeds among distributions of light generated by the light-emitting device 1.

The present invention exemplarily shows a case in which the main emission line L of the light-emitting device 1 passes through at least a part of the flat portion 20. However, the present invention is not limited thereto, and the flat portion 20 may be provided in various shapes at various locations. In addition, as illustrated in FIGS. 1 to 3, the flat portion 20 may also be integrated with and formed of the same material as the lens body 10.

Empirically, as a result of multiple tests, a diameter N of the flat portion 20 for minimizing a dark ring or a bright ring and maximizing the uniformity of light may be $\frac{1}{100}$ to $\frac{1}{10}$ of an inlet diameter D of the light-receiving portion 10a. For example, when the inlet diameter D of the light-receiving portion 10a is about 2.3 mm, the diameter N of the flat portion 20 may be 0.02 mm to 0.2 mm.

However, the diameter N of the flat portion 20 is not limited thereto and may be applied as various values and optimized based on the material of the lens body 10, the shape, size, or length of each portion of the lens body 10, the type of the light-emitting device 1, the type of light, or the like.

For example, as illustrated in FIGS. 1 to 3, in the lens body 10, the light-receiving portion 10a may be a dome-shaped recess which is concave upward, and the light-emitting portion 10b may have a cross section including a left hemisphere S-L having a first curvature R1 and having a first curvature center C1 located at a left side of the main emission line L of the light-emitting device 1, and a right hemisphere S-R having the first curvature R1 and having a second curvature center C2 located at a right side of the main emission line L of the light-emitting device 1.

Here, the recess 10c may have a cross section including a left recess H-L provided from a top surface of the left hemisphere S-L toward a top center point P of the light-receiving portion 10a, and a right recess H-R provided from a top surface of the right hemisphere S-R toward the top center point P of the light-receiving portion 10a. In this case, the flat portion 20 may have a cross section provided between the left and right recesses H-L and H-R.

In addition, as illustrated in FIGS. 1 to 3, in the lens 100 according to some embodiments of the present invention, each of the left and right recesses H-L and H-R may further include a convex portion T protruding from a virtual extension line E of the left and right hemispheres S-L and S-R by a protruding height H to control the amount of light emitted upward from the recess 10c.

Here, the virtual extension line E may be a V-shaped curve having a flat center and including a curve extending along the first curvature R1 based on the first curvature center C1 of the left hemisphere S-L, and a curve extending along the first curvature R1 based on the second curvature center C2 of the right hemisphere S-R (e.g., a dashed line in FIG. 3). Empirically, as a result of multiple tests, the protruding height H for minimizing a dark ring or a bright ring and maximizing the uniformity of light may be 60% to 80% of the diameter N of the flat portion 20.

Figure 4:
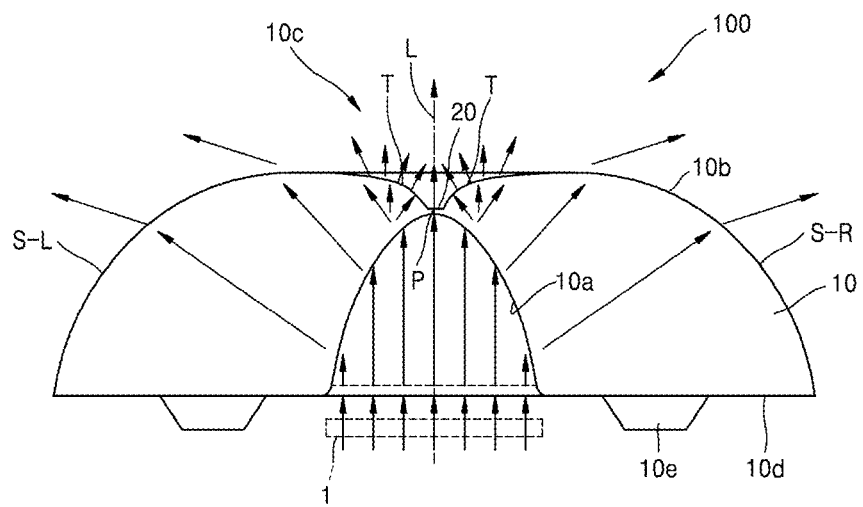
FIG. 4 is a cross-sectional view showing optical paths of the lens of FIG. 2.

FIG. 4 is a cross-sectional view showing optical paths of the lens 100 of FIG. 2.

Optical operation of the lens 100 according to some embodiments of the present invention is now described with reference to FIG. 4. As illustrated in FIG. 4, light generated by the light-emitting device 1 is emitted in front, back, left, and right directions and in an upward direction at all angles, and may be mainly emitted along the main emission line L. Here, a part of light emitted from the light-emitting device 1 may enter the lens body 10 through the light-receiving portion 10a of the lens body 10.

Basically, the most part of light may pass through the light-receiving portion 10a and then converted into side-direction light, i.e., side light, through the light-emitting portion 10b. In this case, since the most part of light is converted into side light, to prevent a dark part from being generated above the light-emitting device 1 or to prevent a bright ring from being generated around the dark part, the flat portion 20 may be provided in a horizontal shape other than a diagonal shape not to reflect but to transmit light emitted upward from the light-emitting device 1, because the flat portion 20 is provided perpendicularly to the main emission line L of light emitted from the light-emitting device 1 and received through the light-receiving portion 10a.

Therefore, a dark ring or a bright ring may be prevented from being generated at an upper portion of the lens 100 by proving the flat portion 20 at the center of the light-emitting portion 10b and controlling the amount of light proceeding upward from the center of the lens 100, overall uniformity of light may be improved by maintaining an appropriate amount of light emitted from the center, and thus a total amount of light may be increased.

Figure 5:
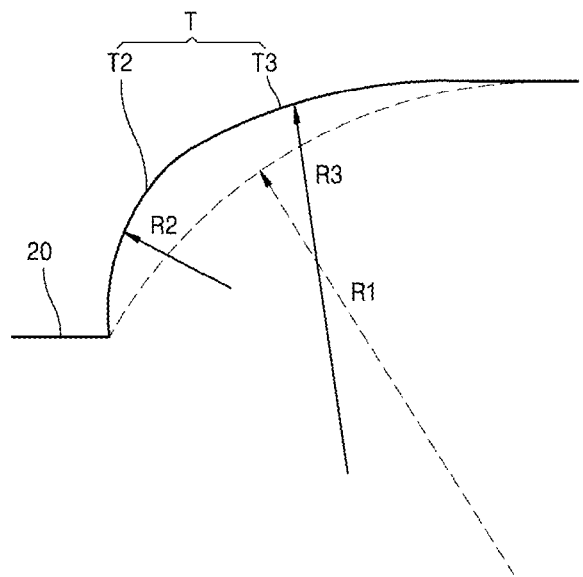
FIG. 5 is a magnified cross-sectional view of an example of a convex portion of the lens of FIG. 2.

FIG. 5 is a magnified cross-sectional view of an example of the convex portion T of the lens 100 of FIG. 2.

As illustrated in FIG. 5, the convex portion T may include a second curvature portion T2 provided relatively close to the flat portion 20 and having a second curvature R2, and a third curvature portion T3 provided relatively far from the flat portion 20, connected to the second curvature portion T2, and having a third curvature R3, and the third curvature R3 may be less than the first curvature R1 and greater than the second curvature R2.

Figure 6:
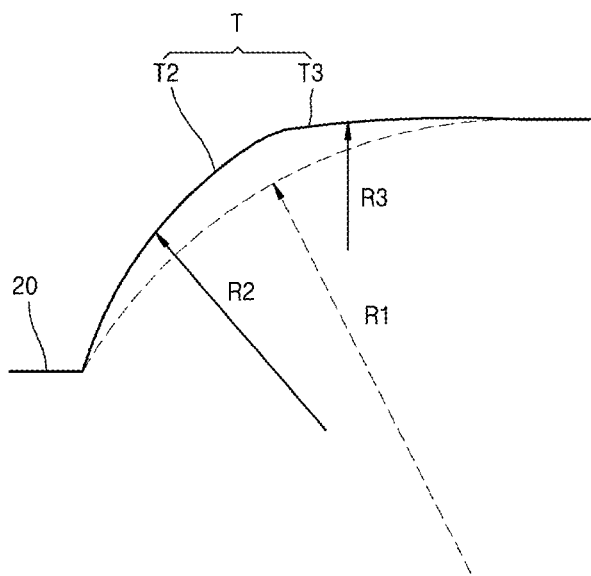
FIG. 6 is a magnified cross-sectional view of another example of the convex portion of the lens of FIG. 2.

FIG. 6 is a magnified cross-sectional view of another example of the convex portion T of the lens 100 of FIG. 2.

Unlike FIG. 5, as illustrated in FIG. 6, the second curvature R2 may be less than the first curvature R1 and greater than the third curvature R3. That is, as illustrated in FIGS. 5 and 6, the convex portion T may include two or more curvature portions, e.g., the second and third curvature portions T2 and T3, and light may be concentrated toward or dispersed from the center of the lens 100 by adjusting the second and third curvature portions T2 and T3.

For example, if a dark part is generated near the center of the lens 100, light may be concentrated toward the center of the lens 100 by slightly increasing the second curvature R2 of the second curvature portion T2 or slightly reducing the third curvature R3 of the third curvature portion T3.

Otherwise, if a bright part is generated near the center of the lens 100, light proceeding toward the center of the lens 100 may be dispersed by slightly reducing the second curvature R2 of the second curvature portion T2 or slightly increasing the third curvature R3 of the third curvature portion T3.

Figure 7:
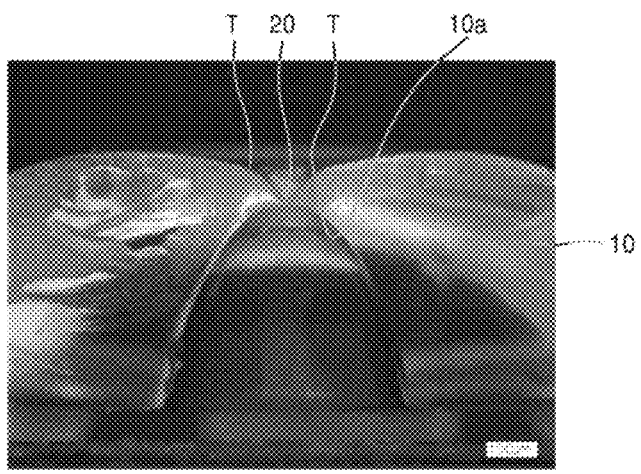
FIG. 7 is a photographic image of the lens of FIG. 2.
Figure 8:
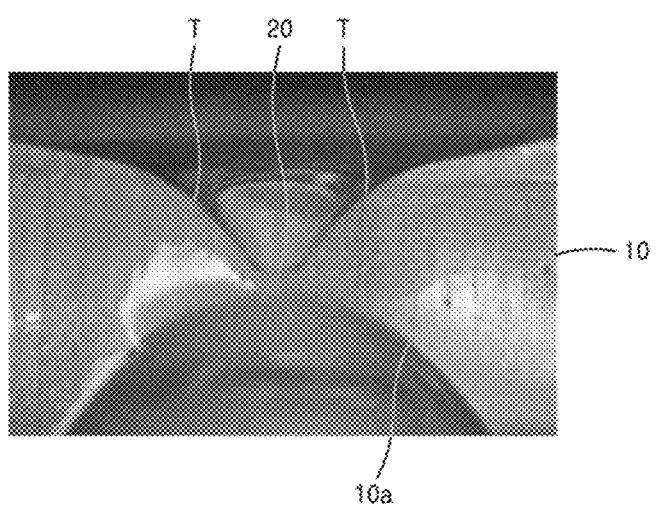
FIG. 8 is a magnified photographic image of the flat portion of the lens of FIG. 7.
Figure 9:
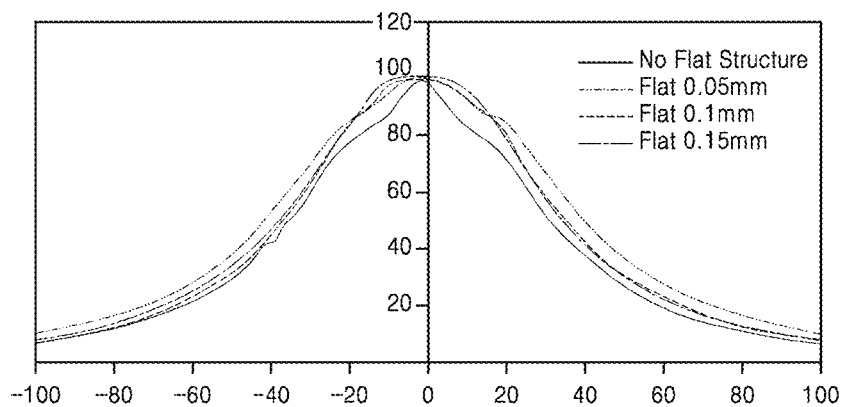
FIG. 9 is a graph showing luminance distribution per diameter of the flat portion of the lens of FIG. 1.

FIG. 7 is a photographic image of the lens 100 of FIG. 2, FIG. 8 is a magnified photographic image of the flat portion 20 of the lens 100 of FIG. 7, and FIG. 9 is a graph showing luminance distribution per diameter of the flat portion 20 of the lens 100 of FIG. 1.

The lens 100 manufactured by reflecting the technical idea of the present invention as illustrated in FIGS. 7 and 8 may achieve round and dull light distribution curves as shown in FIG. 9. For example, a conventional structure including no flat portion, i.e., a light distribution curve indicated by a solid line, shows that a center part) (0° is sharp, valleys are generated near the center part, and thus a dark part is generated. However, when the flat portion 20 according to the technical idea of the present invention is provided and the inlet diameter D of the light-receiving portion 10a is about 2.3 mm, light distribution curves of all cases in which the flat portion 20 has diameters of 0.05 mm (dashed and double-dotted line), 0.1 mm (dashed line), and 0.15 mm (dashed and single-dotted line) show that a center part is round, no valleys are found, and thus a dark part or a bright part is not generated. However, the present invention is not limited to the above-described photographic images or the graph.

Although not shown in any drawing, the present invention may include a backlight unit including a light guide plate provided on an optical path of light emitted from the light-emitting portion 10b of the above-described lens 100 according to some embodiments of the present invention. The light guide plate may be an optical member which can be formed of a light-transmitting material to induce the light emitted from the light-emitting portion 10b.

The light guide plate may be provided on the optical path of the light emitted from the light-emitting portion 10b, to deliver the light to a larger area. Here, although not shown in any drawing, a diffusion sheet, a prism sheet, a filter, etc. may be additionally provided on the light guide plate. Various display panels, e.g., an LCD panel, may be provided on the light guide plate.

Although not shown in any drawing, the present invention may include a lighting apparatus or a display apparatus including the above-described lens 100 and the backlight unit. Here, the configurations and operations of elements of the lighting apparatus or the display apparatus according to some embodiments of the present invention may be the same as those of the elements of the above-described lens 100 according to some embodiments of the present invention. Accordingly, detailed descriptions thereof are not given here.

Figure 10:
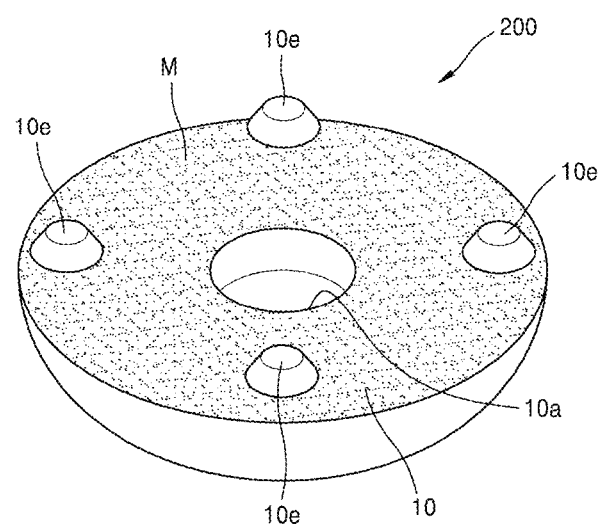
FIG. 10 is a bottom perspective view of a lens for a light-emitting device, according to other embodiments of the present invention.
Figure 11:
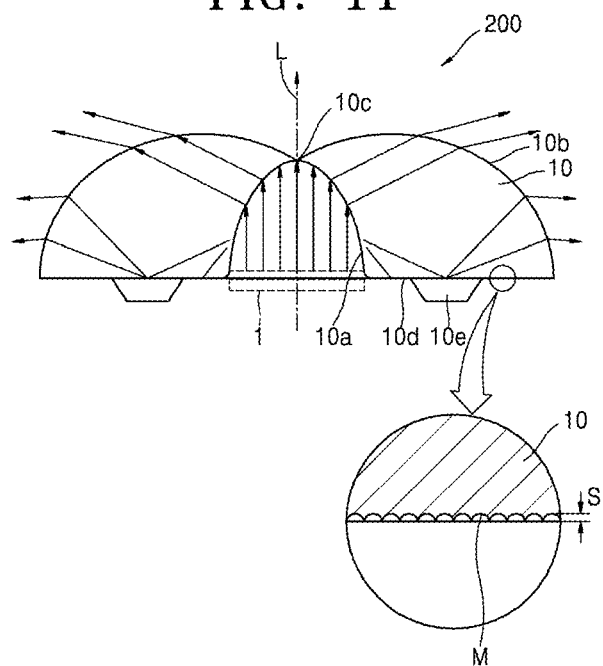
FIG. 11 is a cross-sectional view of the lens of FIG. 10.
Figure 12:
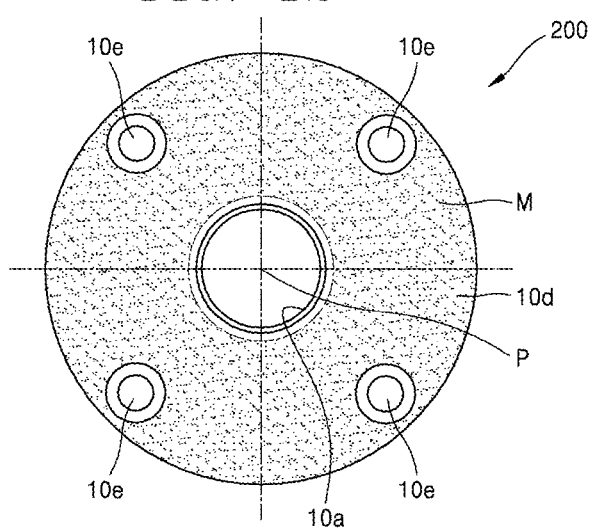
FIG. 12 is a bottom view of the lens of FIG. 10.

FIG. 10 is a bottom perspective view of a lens 200 for a light-emitting device, according to other embodiments of the present invention, FIG. 11 is a cross-sectional view of the lens 200 of FIG. 10, and FIG. 12 is a bottom view of the lens 200 of FIG. 10.

As illustrated in FIGS. 10, 11 and 12, micro-depressions M are provided in the bottom portion 10d provided in a horizontal shape along the edge of the lower surface of the lens body 10, and may have a size in micrometers to reflect or scatter at least a part of light proceeding toward the bottom portion 10d inside the lens body 10.

In this case, the micro-depressions M may have a concave shape into the lens body 10, and spaced apart from a region where the light-emitting device 1 is located, not to allow the light emitted from the light-emitting device 1 to pass the micro-depressions M.

For example, as illustrated in FIGS. 10, 11 and 12, the micro-depressions M may have a size S, e.g., a diameter, height, width, or length, of 3 micrometers to 15 micrometers to induce scattering, diffusion, and reflection of light. Here, the micro-depressions M are not limited to the above-described values, and may have all values and shapes capable of inducing scattering, diffusion, and reflection of light.

For example, the lens body 10 may be produced by injection-molding a light-transmitting base material using a mold, and the micro-depressions M may be produced using a bottom portion counterpart surface-processed in the mold through electric discharge machining (EDM). However, the micro-depressions M are not limited to the EDM technology, and may be produced using a large variety of other technologies such as etching, stamping, printing, coating, grinding, sputtering, and cutting.

Optical operation of the lens 200 according to other embodiments of the present invention is now described with reference to FIG. 11. As illustrated in FIG. 11, light generated by the light-emitting device 1 is emitted in front, back, left, and right directions and in an upward direction at all angles, and may be mainly emitted along a main emission line L. Here, the main emission line L may refer to an axis along a path on which the largest amount of light proceeds among distributions of light generated by the light-emitting device 1.

The present invention exemplarily shows a case in which the main emission line L of the light-emitting device 1 passes through the top center of the light-receiving portion 10a. However, the present invention is not limited thereto, and the main emission line L may be provided at various locations in various shapes inside the light-receiving portion 10a.

That is, a part of light emitted from the light-emitting device 1 may enter the lens body 10 through the light-receiving portion 10a of the lens body 10. Basically, the most part of light may pass through the light-receiving portion 10a and then converted into side-direction light, i.e., side light, through the light-emitting portion 10b. In this case, internal light proceeding toward the bottom portion 10d of the lens body 10 is not lost to the outside and may be partially scattered, diffused, or reflected inside the lens body 10.

Figure 13:
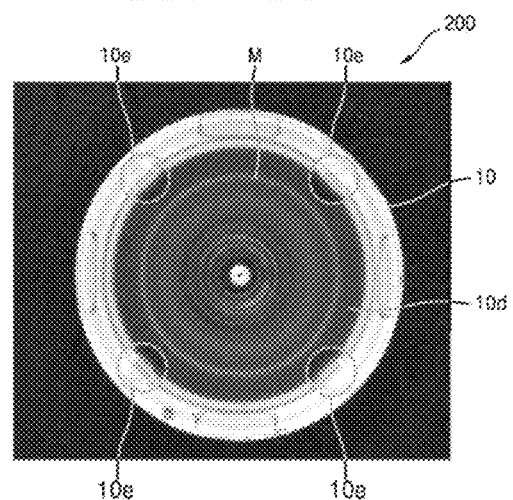
FIG. 13 is a photographic image of a plan view of the lens of FIG. 10.

FIG. 13 is a photographic image of a plan view of the lens 200 of FIG. 10.

As shown in FIG. 13, since the bottom portion 10d of the lens body 10 is black, light is not lost to the outside of the lens body 10 due to the micro-depressions M. Therefore, since the amount of lost light may be highly reduced by the bottom portion 10d of the lens body 10, the efficiency of light may be remarkably increased and thus the amount of light may be greatly increased.

Figure 14:
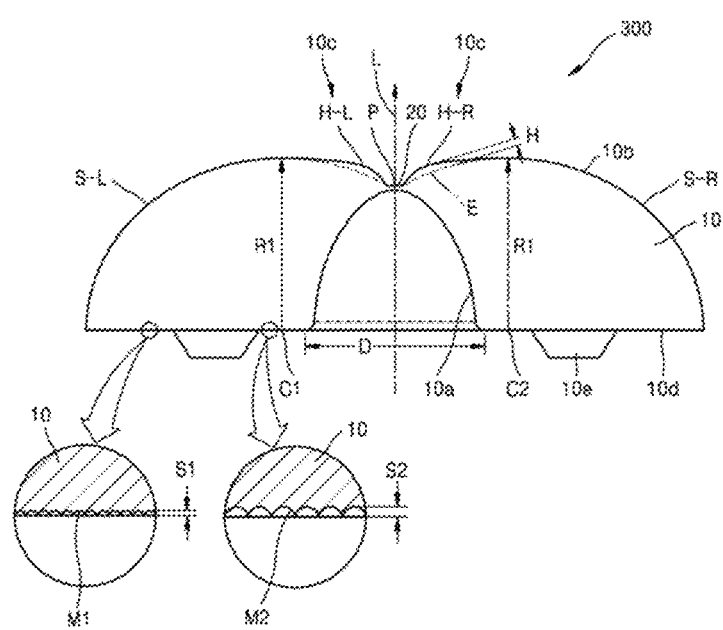
FIG. 14 is a cross-sectional view of a lens for a light-emitting device, according to still other embodiments of the present invention.

FIG. 14 is a cross-sectional view of a lens 300 for a light-emitting device, according to still other embodiments of the present invention.

As illustrated in FIG. 14, the micro-depressions M of the lens 300 according to still other embodiments of the present invention may include first depressions M1 provided close to the light-receiving portion 10a and having a first size S1, and second depressions M2 provided far from the light-receiving portion 10a and having a second size S2.

Here, as illustrated in FIG. 14, the first size S1 of the first depressions M1 may be less than the second size S2 of the second depressions M2. Accordingly, for example, light proceeding closely to the light-receiving portion 10a may be scattered in a larger amount compared to a reflected amount, and light proceeding away from the light-receiving portion 10a may be scattered in a smaller amount compared to a reflected amount.

For example, the first size S1, e.g., a diameter, height, width, or length, of the first depressions M1 may be 3 micrometers to 9 micrometers to induce scattering of light, and the second size S2, e.g., a diameter, height, width, or length, of the second depressions M2 may be 9 micrometers to 15 micrometers to induce reflection of light. Here, the first and second depressions M1 and M2 are not limited to the above-described value, and may have all values and shapes capable of inducing scattering and reflection of light.

A method of manufacturing the lens 200 including the lens body 10 including the light-receiving portion 10a provided in a concave shape at the center of the lower surface of the lens body 10, the bottom portion 10d provided in a horizontal shape along the edge of the lower surface of the lens body 10, and the light-emitting portion 10b provided on the upper surface of the lens body 10, and the micro-depressions M provided in the bottom portion 10d of the lens body 10 and having a size in micrometers to reflect or scatter at least a part of light proceeding toward the bottom portion 10d inside the lens body 10, according to other embodiments of the present invention, includes providing a mold including a lens body counterpart corresponding to the lens body 10 and a micro-depression counterpart corresponding to the micro-depressions M, surface-processing the micro-depression counterpart using electric discharge machining (EDM), and injection-molding a light-transmitting base material into the lens body counterpart and the surface-processed micro-depression counterpart of the mold.

Accordingly, since the mold is produced using the EDM technology, a production time and cost of the mold may be greatly reduced and very fine and precise micro-depressions M may be uniformly generated.

Figure 15:
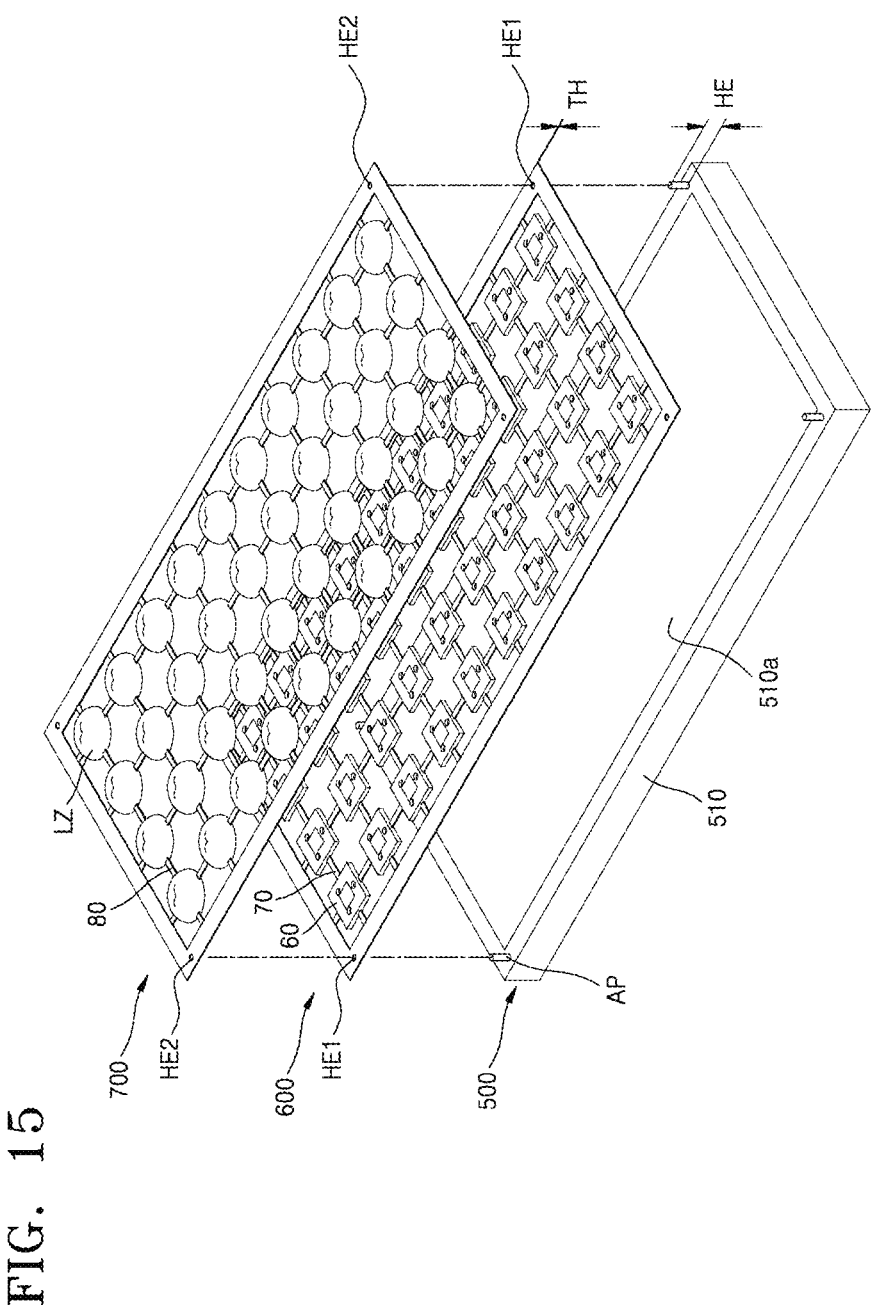
FIG. 15 is a perspective view showing aligned state of an alignment jig, a lead frame strip, and a lens strip for a light-emitting device package, according to some embodiments of the present invention.
Figure 16:
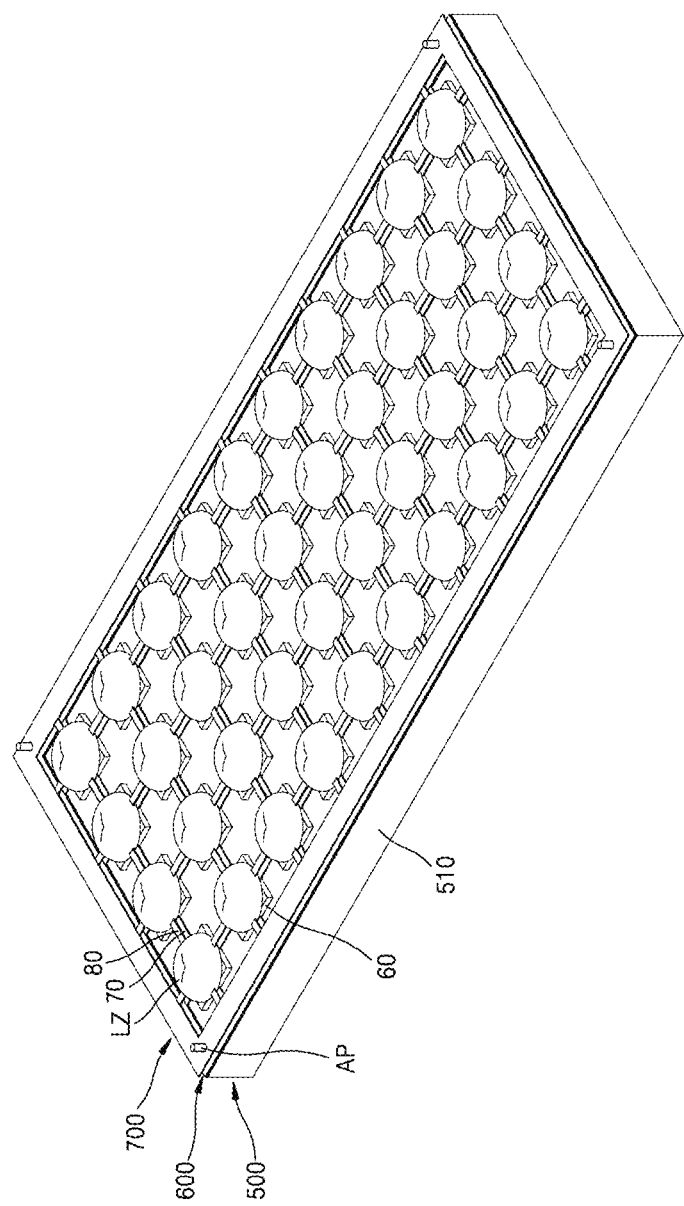
FIG. 16 is a perspective view showing assembled state of the alignment jig, the lead frame strip, and the lens strip of FIG. 15.

FIG. 15 is a perspective view showing aligned state of an alignment jig 500, a lead frame strip 600, and a lens strip 700 for a light-emitting device package, according to some embodiments of the present invention, and FIG. 16 is a perspective view showing assembled state of the alignment jig 500, the lead frame strip 600, and the lens strip 700 of FIG. 15.

As illustrated in FIGS. 15 and 16, the alignment jig 500 according to some embodiments of the present invention may include an alignment jig body 510 including a lead frame counterpart 510a to support the lead frame strip 600, and a plurality of alignment pins AP provided at edges of the alignment jig body 510 to primarily pass through alignment holes HE1 provided in the lead frame strip 600 and to secondarily pass through alignment holes HE2 provided in the lens strip 700 including a plurality of lenses LZ connected to each other, and protruding upward by a height HE at least greater than a thickness TH of the lead frame strip 600.

For example, as illustrated in FIGS. 15 and 16, the alignment jig body 510 may be a structure provided in a rectangular panel shape and formed of metal having high durability and heat resistance. The lead frame counterpart 510a may be provided at the center of an upper surface of the alignment jig body 510. Here, the lead frame counterpart 510a may be a contact surface contacting the lead frame strip 600, or a counterpart recess including the contact surface contacting the lead frame strip 600.

However, the alignment jig body 510 and the lead frame counterpart 510a are not limited to the above-described shapes and material, and a large variety of shapes may be applied thereto. For example, the alignment jig body 510 may have a large variety of shapes, e.g., a polygon, a circle, an oval, and other various geometrical shapes, corresponding to the lead frame strip 600, and may be formed of engineering plastic or various resins having high durability and heat resistance. In addition, as illustrated in FIGS. 15 and 16, the alignment pins AP may be a structure of pins protruding upward from four corners of the alignment jig body 510 or four corners of the lead frame counterpart 510a.

Accordingly, as illustrated in FIGS. 15 and 16, the alignment pins AP may primarily pass through the alignment holes HE1 of the lead frame strip 600, and secondarily pass through the alignment holes HE2 of the lens strip 700 to align the lead frame strip 600 and the lens strip 700 to accurate locations thereof.

Meanwhile, as illustrated in FIGS. 15 and 16, the lead frame strip 600 according to some embodiments of the present invention may include a plurality of lead frames 50 arranged in a matrix at equal intervals, a reflective encapsulant 60 molded on the lead frames 50, and a frame bridge 70 having the alignment holes HE1 for passing the alignment pins AP of the alignment jig 500 therethrough to be aligned on the alignment jig 500.

Figure 20:
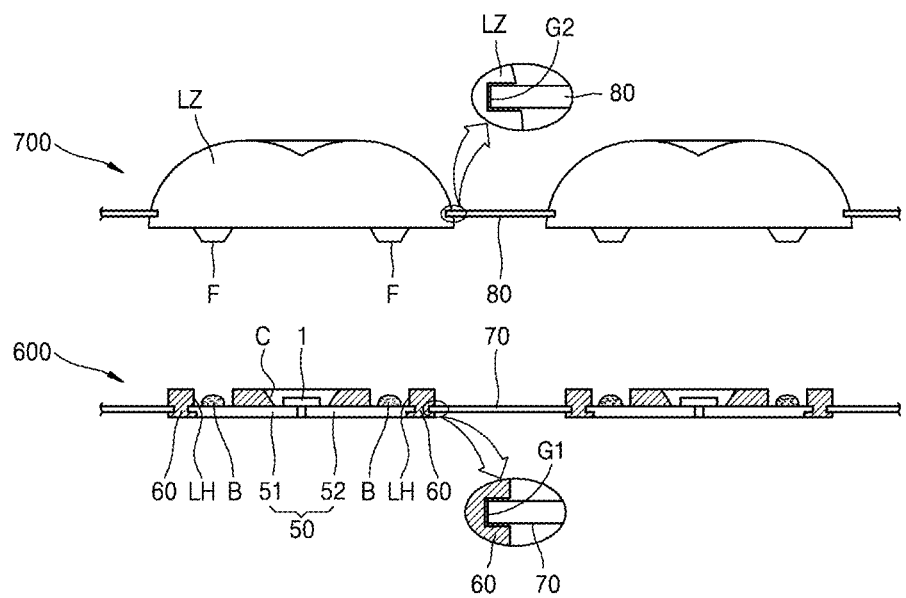
FIG. 20 is a cross-sectional views showing a bonding process of the alignment jig, the lead frame strip, and the lens strip of FIG. 15.
Figure 21:
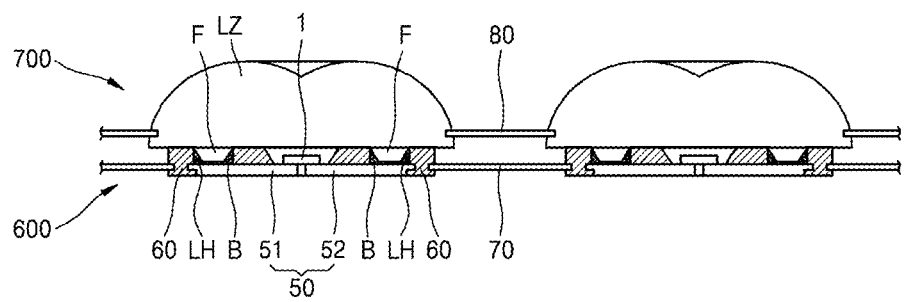
FIG. 21 is a cross-sectional views showing a bonding process of the alignment jig, the lead frame strip, and the lens strip of FIG. 15.

FIG. 20 is a magnified cross-sectional view showing the state before the lead frame strip 600 of FIG. 15 is bonded, and FIG. 21 is a magnified cross-sectional view showing the state after the lead frame strip 600 of FIG. 20 is bonded using an adhesive B.

For example, as illustrated in FIGS. 20 and 21, the frame bridge 70 may be a structure formed of metal or resin insert-injection-molded to be temporarily inserted into connection grooves G1 of the reflective encapsulant 60 to temporarily interconnect the lead frames 50 adjacent to each other. Accordingly, the frame bridge 70 may be easily removed from the reflective encapsulant 60 using a small external force or impact in a subsequent singulation process, and thus individual light-emitting device packages may be achieved.

In addition, for example, as illustrated in FIGS. 20 and 21, the lead frame strip 600 may include the reflective encapsulant 60 molded in a plurality of pieces, and the lead frames 50 having mounted a plurality of light-emitting devices 1 thereon and connected to each other by the frame bridge 70 in reflective cups C of the reflective encapsulant 60. For example, the lead frames 50 may include a first electrode 51 and a second electrode 52 electrically separate from each other by an electrode separation space and formed of metal such as aluminum (Al), copper (Cu), zinc (Zn), tin (Sn), lead (Pb), gold (Au), or silver (Ag). The reflective cups C may be filled with at least one selected from the group consisting of an air gap, a light-transmitting encapsulant, a phosphor, quantum dots, and a combination thereof.

However, the lead frames 50 are not limited to the drawings, and a printed circuit board (PCB) obtained by stacking a plurality of epoxy-based resin sheets on one another may be used instead. Alternatively, a flexible printed circuit board (FPCB) formed of a flexible material may be used instead of the lead frames 50. Otherwise, instead of the lead frames 50, a synthetic resin substrate formed of, for example, resin or glass epoxy may be used or a ceramic substrate may be used in consideration of heat conductivity. The adhesive B may include an epoxy component. In addition, all types of adhesive resin or metal, e.g., adhesive silicon or polymer, may be used.

Accordingly, as illustrated in FIGS. 15 and 16, the lead frames 50 may be arranged in a matrix and connected to each other by the frame bridge 70, and the above-described lead frame strip 600 may be aligned on the alignment jig 500 by the alignment holes HE1 provided at outer corners of the frame bridge 70 to pass the alignment pins AP therethrough.

Meanwhile, as illustrated in FIGS. 15 and 16, the lens strip 700 according to some embodiments of the present invention may include a lens bridge 80 having the alignment holes HE2 for passing the alignment pins AP of the alignment jig 500 therethrough to align the lenses LZ arranged in a matrix at equal intervals, on the alignment jig 500.

For example, as illustrated in FIGS. 20 and 21, the lens bridge 80 may be a structure formed of metal or resin insert-injection-molded to be temporarily inserted into connection grooves G2 of the lenses LZ to temporarily interconnect the lenses LZ adjacent to each other.

Here, as illustrated in FIGS. 15 and 16, the interconnected lenses LZ of the lens strip 700 may be located to correspond to lens holes LH provided in the reflective encapsulant 60. Each of the lenses LZ may be an integrated structure formed of a light-transmitting material and including a light-receiving portion provided at the center of a lower surface of the lens LZ, a bottom portion of a horizontal shape and legs F provided along the edge of the lower surface of the lens LZ, a light-emitting portion provided on an upper surface of the lens LZ, and a recess provided in the light-emitting portion.

However, the light-receiving portion, the light-emitting portion, the recess, the bottom portion, and the legs F of the lens LZ are not limited to the drawings, and may be modified or changed to a variety of designs, shapes, materials, etc. without departing from the technical idea of the present invention.

Accordingly, as illustrated in FIGS. 15 and 16, the lenses LZ may be arranged in a matrix and connected to each other by the lens bridge 80, and the above-described lens strip 700 may be aligned on the alignment jig 500 by the alignment holes HE2 provided at outer corners of the lens bridge 80 to pass the alignment pins AP therethrough.

FIGS. 17 to 22 are cross-sectional views showing a bonding process of the alignment jig 500, the lead frame strip 600, and the lens strip 700 of FIG. 15.

Figure 17:
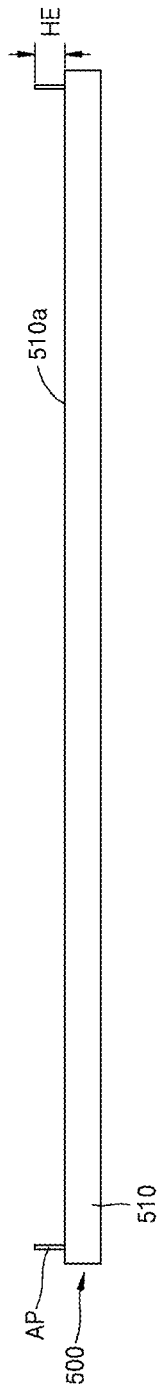
FIG. 17 is a cross-sectional views showing a bonding process of the alignment jig, the lead frame strip, and the lens strip of FIG. 15.

A method of manufacturing a light-emitting device package 1000, according to some embodiments of the present invention, is now described with reference to FIGS. 17 to 22. Initially, as illustrated in FIG. 17, the above-described alignment jig 500 including one or more alignment pins AP may be prepared.

Figure 18:
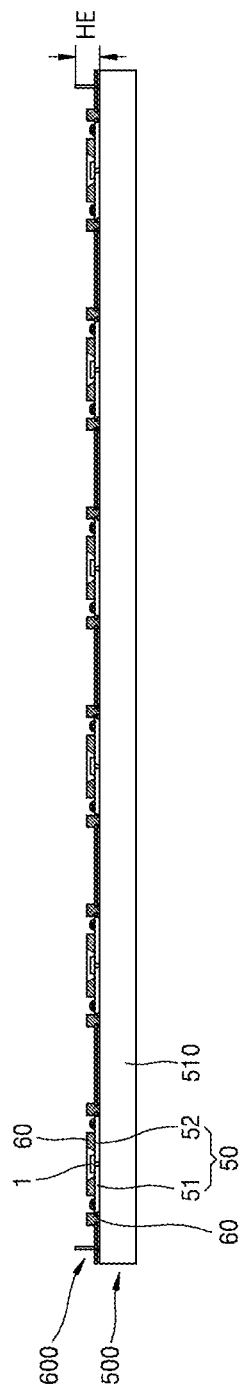
FIG. 18 is a cross-sectional views showing a bonding process of the alignment jig, the lead frame strip, and the lens strip of FIG. 15.

Then, as illustrated in FIG. 18, the lead frame strip 600 may be aligned on the alignment jig 500 by passing the alignment pins AP through the alignment holes HE1 of the lead frame strip 600 having mounted a plurality of light-emitting devices 1 thereon. In this case, as illustrated in FIG. 18, the adhesive B including an epoxy component may be applied in the lens holes LH of the aligned lead frame strip 600. The adhesive B may be applied using a large variety of schemes such as dispensing, dotting, injecting, printing, squeeze printing, inkjet printing, bubble jet printing, stamping, and transferring.

Figure 19:
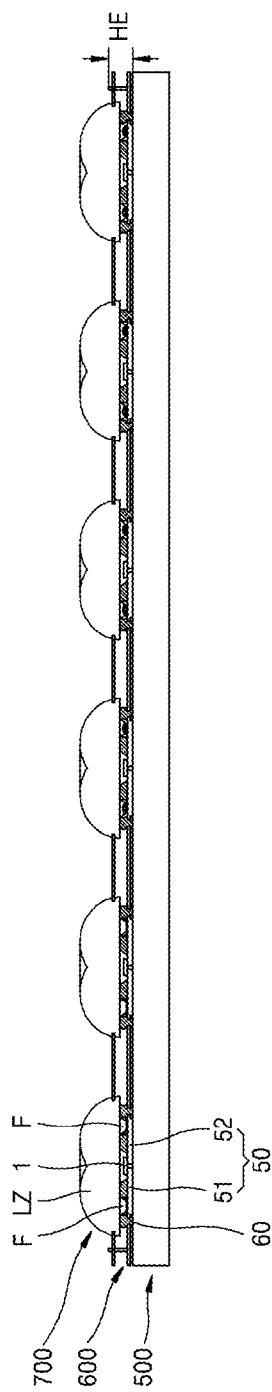
FIG. 19 is a cross-sectional views showing a bonding process of the alignment jig, the lead frame strip, and the lens strip of FIG. 15.

Thereafter, as illustrated in FIG. 19, the lens strip 700 may be aligned on the lead frame strip 600 by passing the alignment pins AP through the alignment holes HE2 of the lens strip 700 including the lenses LZ connected to each other and, as illustrated in FIGS. 20 and 21, the legs F of the lenses LZ may be inserted and bonded into the lens holes LH in which the adhesive B is applied.

Figure 22:
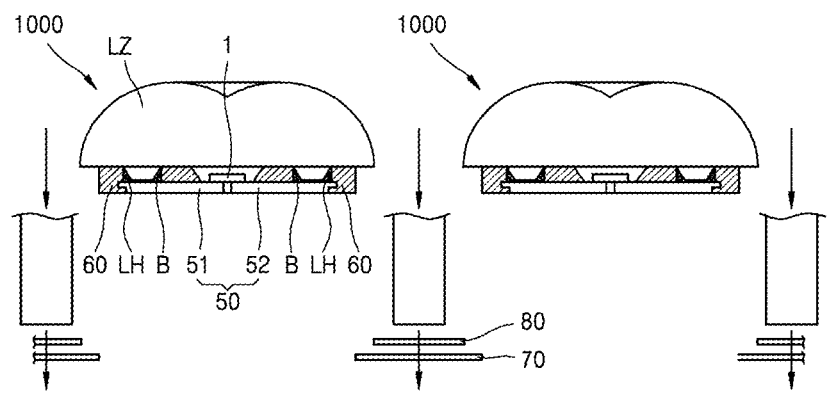
FIG. 22 is a cross-sectional views showing a bonding process of the alignment jig, the lead frame strip, and the lens strip of FIG. 15.

Then, as illustrated in FIG. 21, the adhesive B is cured by heating the lead frame strip 600 and the lens strip 700 bonded to each other. Subsequently, as illustrated in FIG. 22, the lens strip 700 having bonded the lead frame strip 600 thereto may be separated from the alignment jig 500, and then the frame bridge 70 and the lens bridge 80 may be removed from the lead frame strip 600 and the lens strip 700 having the cured adhesive B therebetween, using a variety of cutting devices, thereby singulating the lead frame strip 600 and the lens strip 700 into individual light-emitting device packages 1000.

In this case, the frame bridge 70 and the lens bridge 80 are insert-injection-molded to be easily removed using a small external force or impact. As such, a singulation process of the individual light-emitting device packages 1000 may be very simple, and scratches or burrs of each of the individual light-emitting device packages 1000 may be minimized.

Figure 23:
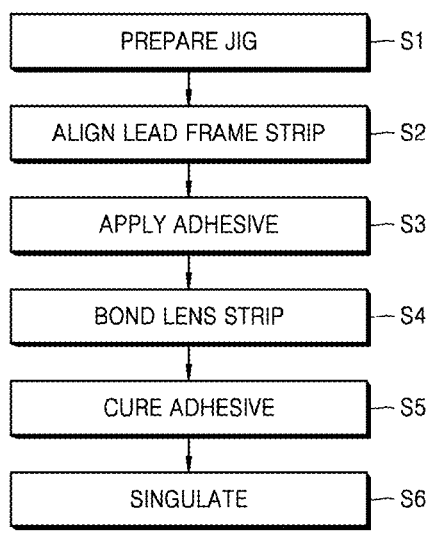
FIG. 23 is a flowchart of a method of manufacturing a light-emitting device package, according to some embodiments of the present invention.

FIG. 23 is a flowchart of a method of manufacturing the light-emitting device package 1000, according to some embodiments of the present invention.

As illustrated in FIGS. 15 to 23, the method of manufacturing the light-emitting device package 1000, according to some embodiments of the present invention may include preparing the alignment jig 500 including one or more alignment pins AP (S1), aligning the lead frame strip 600 on the alignment jig 500 by passing the alignment pins AP through the alignment holes HE1 of the lead frame strip 600 having mounted a plurality of light-emitting devices 1 thereon (S2), applying the adhesive B in the lens holes LH of the aligned lead frame strip 600 (S3), aligning the lens strip 700 on the lead frame strip 600 by passing the alignment pins AP through the alignment holes HE2 of the lens strip 700 including the lenses LZ connected to each other, and inserting and bonding the legs F of the lenses LZ into the lens holes LH in which the adhesive B is applied (S4), curing the adhesive B by heating the lead frame strip 600 and the lens strip 700 bonded to each other (S5), and singulating the lead frame strip 600 and the lens strip 700 having the cured adhesive B therebetween, into individual light-emitting device packages 1000 (S6).

As described above, according to some embodiments of the present invention, a dark part, a dark ring, a bright part, or a bright ring may be prevented, overall uniformity of light may be improved, and thus the amount of light may be increased. However, the scope of the present invention is not limited to the above effects.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A lens for a light-emitting device, the lens comprising:
a lens body comprising a light-receiving portion provided in a lower surface of the lens body, a light-emitting portion provided on an upper surface of the lens body, and a recess provided at a center of the upper surface of the lens body; and
a flat portion provided in a horizontal shape on a bottom surface of the recess and perpendicular to a main emission line of light emitted from a light-emitting device such that at least part of light received through the light-receiving portion emits upwardly,
wherein a diameter of the flat portion is $1/100$ to $1/10$ of an inlet diameter of the light-receiving portion,
wherein the light-receiving portion is a dome-shaped recess which is concave upward,
wherein the light-emitting portion has a cross section comprising a left hemisphere including a first curvature and a first curvature center located at a left side of a centerline, and a right hemisphere including the first curvature and a second curvature center located at a right side of the centerline,
wherein the recess includes a cross section comprising: a left recess provided from a top surface of the left hemisphere toward a top center point of the light-receiving portion, and a right recess provided from a top surface of the right hemisphere toward the top center point of the light-receiving portion, and
wherein the flat portion includes a cross section provided between the left and right recesses.

2. The lens of claim 1, wherein each of the left and right recesses further comprises a convex portion protruding from a virtual extension line of the left and right hemispheres by a protruding height to control an amount of light emitted upward from the recess.

3. The lens of claim 2, wherein the protruding height is approximately 60% to approximately 80% of a diameter of the flat portion.

4. The lens of claim 2, wherein the convex portion comprises:
a second curvature portion provided relatively close to the flat portion and including a second curvature; and
a third curvature portion provided relatively far from the flat portion, connected to the second curvature portion, and including a third curvature.

5. The lens of claim 4, wherein the third curvature is less than the first curvature and is greater than the second curvature.

6. The lens of claim 4, wherein the second curvature is less than the first curvature and is greater than the third curvature.

7. A lens for a light-emitting device, the lens comprising:
a lens body that includes a light-receiving portion for providing a space for accommodating the light-emitting device, receiving light emitted from the light-emitting device, and provided in a concave shape at a center of a lower surface of the lens body, wherein the lens body further includes a recess provided at a center of an upper surface of the lens body;
a flat portion provided in a horizontal shape on a bottom surface of the recess and perpendicular to a main emission line of light emitted from the light-emitting device such that at least part of light received through the light-receiving portion emits upwardly;
a bottom portion provided in a horizontal shape along an edge of the lower surface of the lens body;
a light-emitting portion for emitting the received light and provided on an upper surface of the lens body; and
micro-depressions provided in the bottom portion of the lens body and having a size in micrometers to reflect or scatter at least a part of light proceeding toward the bottom portion inside the lens body,
wherein the micro-depressions have a concave shape into the lens body, and spaced apart from a region where the light-emitting device is located, not to allow the light emitted from the light-emitting device to pass the micro-depressions.

8. The lens of claim 7,
wherein the lens body is produced by injection-molding a light-transmitting base material using a mold, and
wherein the micro-depressions are produced using a bottom portion counterpart surface-processed in the mold through electric discharge machining (EDM).

9. The lens of claim 7, wherein the micro-depressions have a size of 3 micrometers to 15 micrometers.

10. The lens of claim 7, wherein the micro-depressions comprise:
first depressions provided close to the light-receiving portion and having a first size; and
second depressions provided far from the light-receiving portion and having a second size.

\* \* \* \* \*